United States Patent
Maier et al.

[19]

[11] Patent Number: 5,887,342
[45] Date of Patent: Mar. 30, 1999

[54] METHOD FOR MAKING AN ELECTRONIC CONTROL UNIT

[75] Inventors: Reinhold Maier, Rosenheim; Ernst Schmidt, Ismaning, both of Germany

[73] Assignee: Bayerische Motoren Werke Aktiengesellschaft, Germany

[21] Appl. No.: 798,502

[22] Filed: Feb. 10, 1997

[30] Foreign Application Priority Data

Feb. 8, 1996 [DE] Germany ................. 196 04 614.9
Jun. 19, 1996 [DE] Germany ................. 196 24 478.1

[51] Int. Cl.⁶ .................................................. H01R 43/00
[52] U.S. Cl. .................. 29/827; 29/622; 264/272.15; 264/272.16; 264/272.17
[58] Field of Search ............................ 29/827, 883, 622; 264/272.15, 272.16, 272.17

[56] References Cited

U.S. PATENT DOCUMENTS

| | | | |
|---|---|---|---|
| 3,423,516 | 1/1969 | Segerson | 29/827 X |
| 3,778,887 | 12/1973 | Suzuki et al. | 29/827 X |
| 3,798,763 | 3/1974 | Deltoer | 29/883 X |
| 4,197,636 | 4/1980 | Osanai | 29/883 X |
| 4,388,757 | 6/1983 | Takeyama et al. | 29/883 X |
| 4,637,130 | 1/1987 | Fujii et al. | 29/827 |
| 4,675,989 | 6/1987 | Galloway et al. | 29/827 X |
| 4,821,413 | 4/1989 | Schmitt et al. | 29/883 |
| 4,887,347 | 12/1989 | Hikita | 29/622 X |
| 4,965,933 | 10/1990 | Mraz et al. | 29/822 |
| 5,131,138 | 7/1992 | Crouse | 29/622 |
| 5,245,216 | 9/1993 | Sako. | |
| 5,264,730 | 11/1993 | Matsuzaki et al. | |

FOREIGN PATENT DOCUMENTS

| | | |
|---|---|---|
| 3612576C1 | 6/1987 | Germany. |
| 4031051A1 | 5/1991 | Germany. |
| 4233254A1 | 4/1994 | Germany. |
| 44 04 986 A1 | of 1995 | Germany. |
| 4325712A1 | 2/1995 | Germany. |
| 4404986A1 | 8/1995 | Germany. |

OTHER PUBLICATIONS

German Search Report dated Nov. 21, 1996.
German Search Report dated Jun. 19, 1996.

*Primary Examiner*—Carl J. Arbes
*Attorney, Agent, or Firm*—Evenson, McKeown, Edwards & Lenahan P.L.L.C.

[57] ABSTRACT

In manufacturing an electronic control unit, a stamped grid is assembled with electronic components and the components are electrically connected with parts of the stamped grid. Subsequently, a body is formed by injection molding plastic material around the components and assembling ends of the grid structure which remain free with fit-on components and electrically connect them. The fit-on components with the body are again surrounded by injection molding by plastic material, while leaving open an exterior frame structure of the stamped grid. Finally, the frame structure is assembled with additional components and/or stamped off.

8 Claims, 5 Drawing Sheets

METHOD FOR MAKING AN ELECTRONIC CONTROL UNIT

BACKGROUND AND SUMMARY OF THE INVENTION

This invention relates to an electronic control unit of the type having a housing unit and a stamped sheet metal part for a strip conductor, with electric components arranged thereon, and to a process for manufacturing such a control unit.

A control unit of this type and a process for manufacturing it are disclosed in German patent document DE 44 04 986 A1. There, the strip conductor structure is fastened on a carrier, and thereafter electronic components are bonded with it. At the application site (in this case, an electric motor controlled by the control unit), the carrier is provided with a cover, so that the strip conductor structure and the components are sheathed by a housing.

The manufacturing of this known control unit requires high expenditures. It also has a low mechanical stability because, for example, the housing offers protection against only moisture or dirt, and does not increase the mechanical stability of the control unit, which is determined essentially by the stability of the carrier.

It is an object of the present invention to provide an electronic control unit of the initially mentioned type which has a high mechanical stability, and can be manufactured in a particularly simple fashion.

This object is achieved by the control unit according to the invention, which has a housing produced by means of injection molding, resulting in a compact construction that is largely unsusceptible to mechanical as well as thermal and atmospheric influences. The manufacturing takes place by means of the injection molding technique known from integrated circuits which are easy to handle and which have a high degree of maturity. The mechanical and thermal characteristics of the control unit can be optimally adapted to satisfy applicable requirements, as a function of the plastic material which is used and/or the applied manufacturing process.

According to one embodiment of the invention, additional structural strip conductor sections are used, so that sensitive components, which would be damaged during the manufacturing of the housing, can be moved to the outside, and can later be fastened to the control unit. This arrangement permits further adaptation of the plastics-related technique to the required mechanical characteristics of the housing, because the loading capacity of the other electric components arranged in the housing no longer has to be taken into account.

Within the scope of the manufacturing process, the contact parts can subsequently be adapted to the applicable requirements, and may be constructed as plug-type, soldered or other connections. In addition to the possibility of constructing these contacts later, it is also possible to construct them before the injection molding takes place around the components, for example, during the manufacturing of the stamping itself.

Another object of the present invention is to broaden the applicability of the process, and to create electronic control units which are constructed of various components and which are combined to a whole within the scope of different manufacturing processes. In this case, the mechanical loadability of the components is to be taken into account, and the mechanical and thermal load on the components is to be minimized during the manufacturing process.

In the multi-step manufacturing process of the electronic control unit (explained in detail by means of FIGS. 9 and beyond), a sequence of treatment operations is formed which, originating from the stamped grid as the mechanical basis, compensates the reduction of the mechanical stability which results from the stamped grid, by offsetting it with a simultaneous buildup of an alternative mechanical stability generated by a surrounding injection molding. This stability is based on the bodies made of a plastic material which are formed during first and second injection-molding-around operations. Together with the respective remaining portions of the stamped grid, these bodies provide sufficient stability of the control unit. At the same time, the molding-around operations achieve mechanical, thermal and chemical protection of components around which injection molding takes place; and the contacts between the components and the stamped grid structures are stabilized.

To achieve the above-mentioned objects, a duroplastic material is particularly suitable for the first molding-around operation and a thermoplastic material is particularly suitable for the second molding-around operation. Duroplastic materials are filled into a tool under pressure, and their molecular chains are interlinked at a higher temperature. These materials are known under commercial names, such as "NITTO 10-2" and are suitable for the direct sheathing of silicon semiconductors because of their minimal content of impurities, good thermal characteristics and good mechanical characteristics. However, the design possibilities are limited.

Thermoplastic materials, created by cooling a melting, are known under commercial names, such as "Hostalen". They are not suitable for the direct coating of semiconductors but, with a corresponding construction of the molds, can form complicated mechanical designs, such as housings with injection-molded-on plug collars.

Other objects, advantages and novel features of the present invention will become apparent from the following detailed description of the invention when considered in conjunction with the accompanying drawings.

DETAILED DESCRIPTION OF THE DRAWINGS

Figure 1:
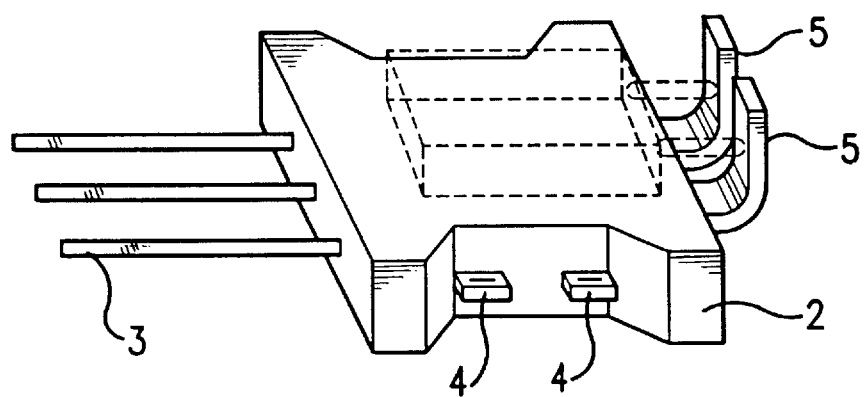
FIG. 1 is a perspective view of a completed electronic control unit according to the invention.
Figure 7:
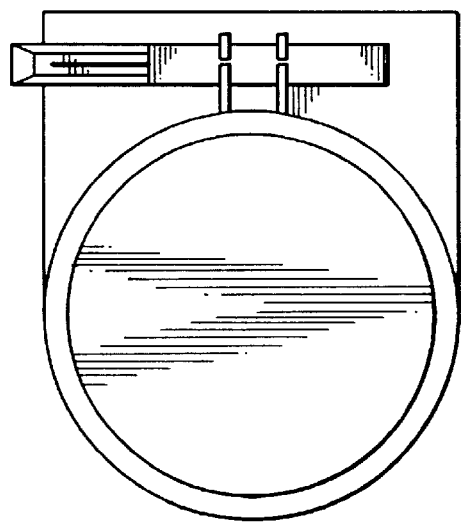
FIG. 7 is a view of the control unit of FIG. 6 in the installed condition.

The electronic control unit illustrated in FIG. 1 has a housing 2, from which plug contacts 3, connector contacts 4 and 4' (FIG. 2) as well as other connector contacts 5 protrude. It is used, for example, for controlling a stepping motor (FIG. 7).

Figure 2:
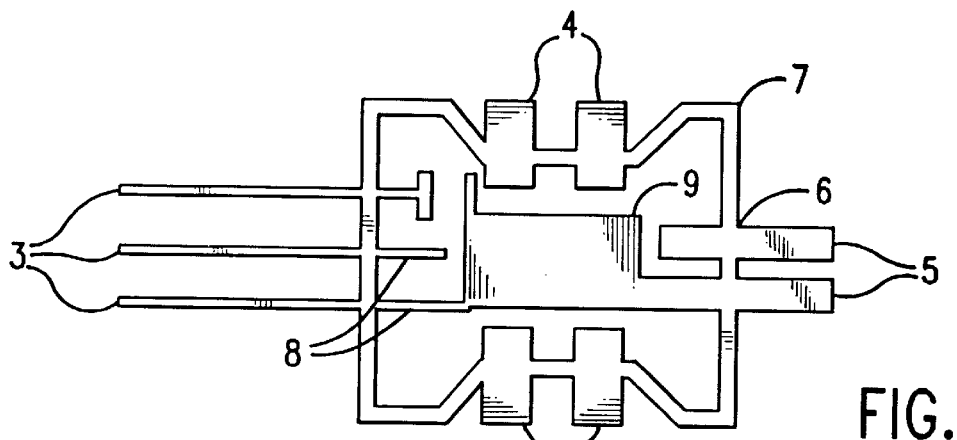
FIGS. 2 through 5 are views of individual steps of the manufacturing process for the control unit of FIG. 1.
Figure 3:
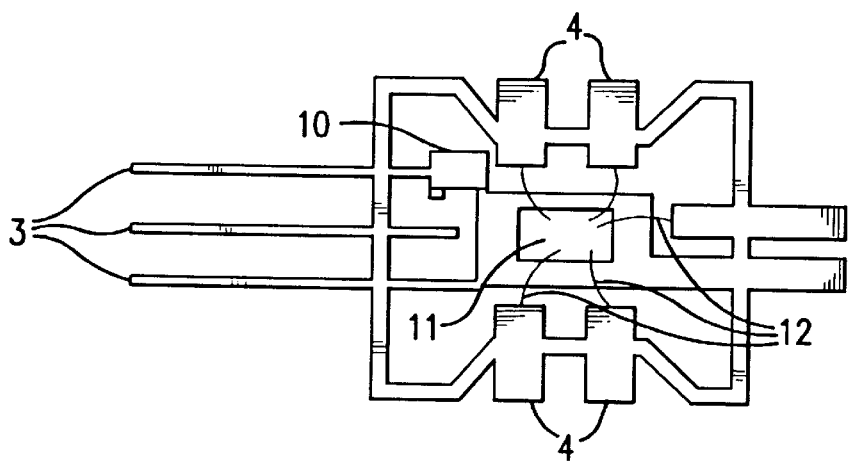

As shown in FIG. 2, the control unit 1 is manufactured from a sheet metal stamping 6 which comprises an auxiliary frame 7 and contacts parts 3, 4, and 5 connected therewith, contact parts 4' corresponding to the contacts 4, strip conductor sections 8, and a central carrier 9. After the manufacture of the sheet metal stamping 6, electronic components, such as a chip capacitor 10 and a microprocessor 11 are fixed at the indicated points, and connected by bonding wires with the associated connections 3, 4, 4' and 5 (FIG. 3).

Figure 4:
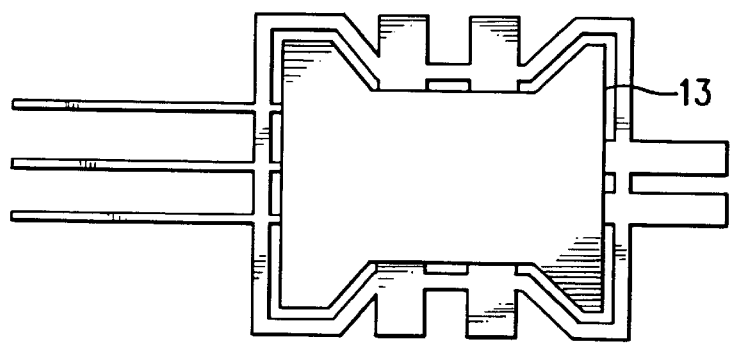
Figure 5:
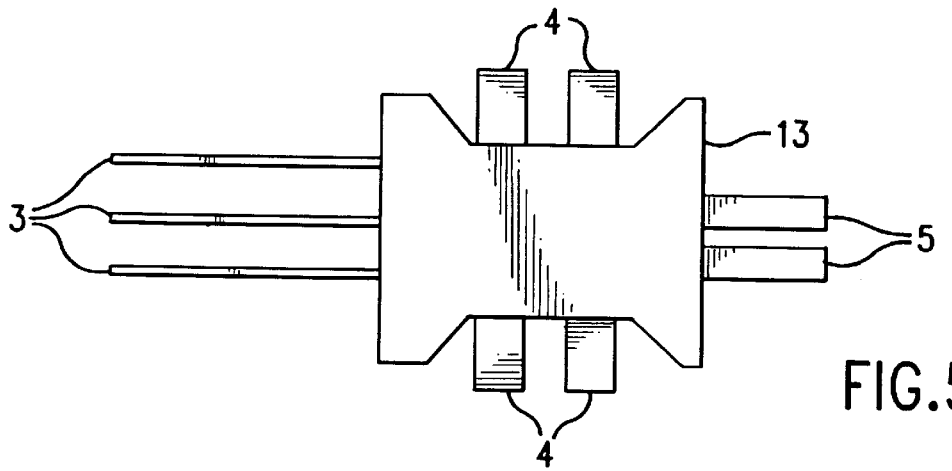

Subsequently, a known injection molding technique is used to surround the stamping with plastic and the housing 13 is formed (FIG. 4). The auxiliary frame 7 is then removed, as illustrated in FIG. 5. The connections 3, 4, 4' and 5 remain standing and can be aftertreated. They may, for example, be soldered or, as indicated in the case of connections 4 and 4', stamped out at the indicated point and thus be provided with openings.

The control unit thus constructed is mechanically stable. Both the components and the bonding wires leading to the connections are completely protected against external thermal, mechanical and chemical influences.

Figure 6:
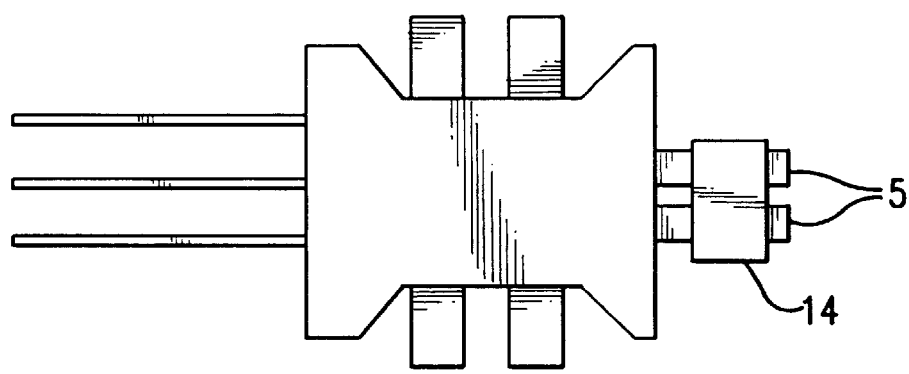
FIG. 6 is a top view of another embodiment of the control unit of FIG. 1.

The embodiment of FIG. 6 illustrates how the two connections 5 are used to carry a removed component, such as a resonator 14. This resonator 14 will be arranged after the manufacturing of the housing 13. In this case, the connections 5 can be bent upward, as shown in FIG. 1.

The control unit thus formed can be used, for example, to control a stepping motor 15. For this purpose, the control unit is arranged on the top side of the motor in a manner known per se, and is connected with the motor 15 by means of the connections 4 and 4' (FIG. 7).

Figure 8:
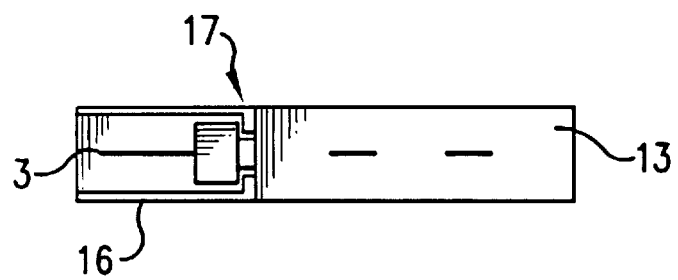
FIG. 8 is a side view of another embodiment of the control unit.

A housing 16 can also be provided, for example, for the plug contacts 3, which can subsequently be connected with the body 13. For this purpose, the body 13, for example, has a groove 17 (FIG. 8) into which the plug housing 16 is clipped. The connections 3 will then, in addition, be protected and permit a problem-free connection of a plug to an electronic control unit 1 (not shown). In this manner, an electronic control unit is obtained which has a simple construction and manufacturing and nevertheless has a high mechanical and thermal stability.

Figure 9:
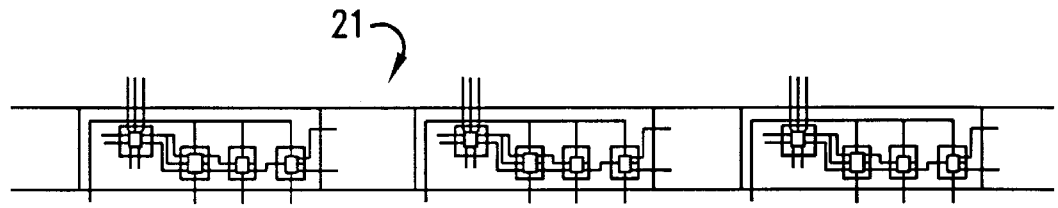
FIGS. 9 through 16 are views of the individual steps of a multi-step manufacturing process for an electronic control unit.
Figure 10:
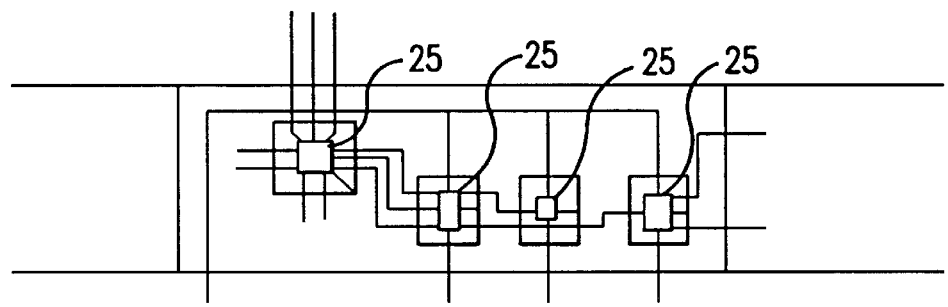

FIG. 9 illustrates a stamped grid 21 which is used for the manufacturing of a total of three identical electronic control units 22 to 24. (FIG. 2 is a detailed representation of the stamped grid for each of the control units.) FIG. 10 illustrates the next step of the manufacturing process, in which ICs 25 are applied to the individual nodal points of the stamped grid and are bonded with parts of the stamped grid.

Figure 11:
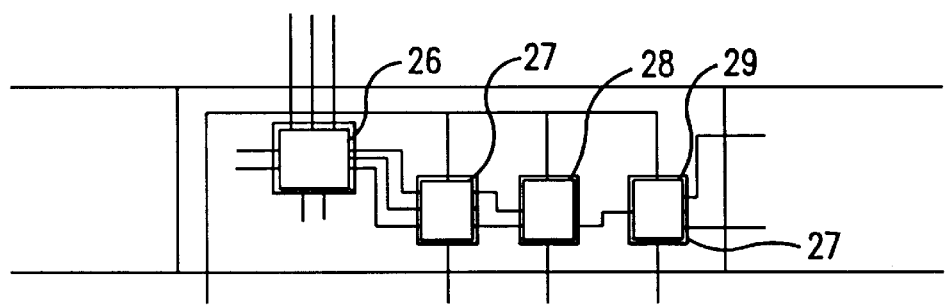

FIG. 11 shows the control units after the first injection-molding operation has been carried out. During this operation, a duroplastic material is injection-molded around the parts of the stamped grid together with the ICs arranged on them. This results in the formation of individual bodies 26 to 29 at four points respectively, which bodies are connected with one another by way of parts of the stamped grid.

Figure 12:
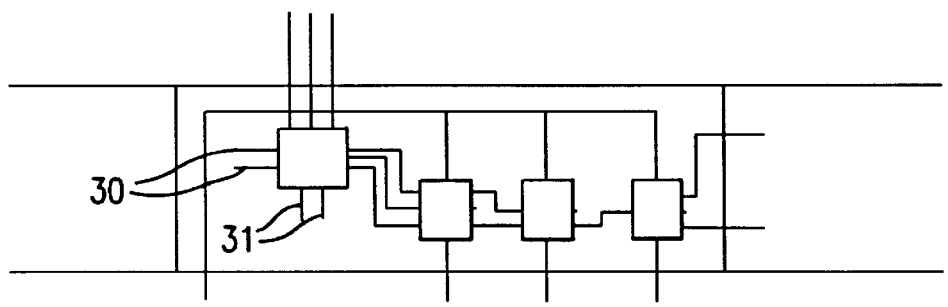
Figure 13:
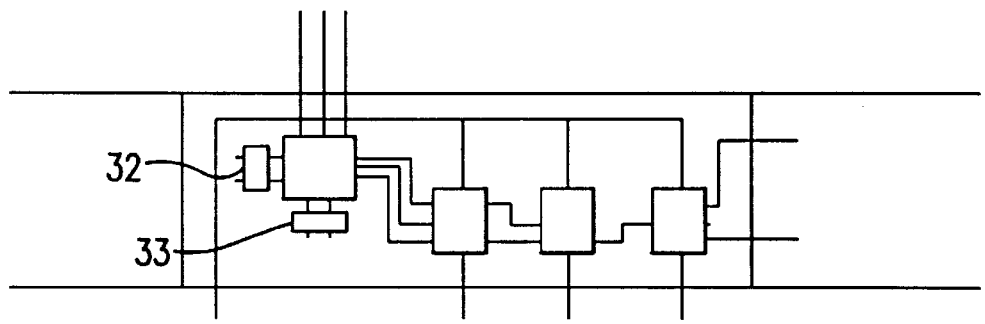

During the next treatment operation, illustrated in FIG. 12, the stamped grid frame is stamped on to the extent that it surrounds the individual bodies and provides them with mechanical stability within the scope of the manufacturing steps illustrated in FIGS. 10 and 11. Only the stamped grid structures will then still exist between the bodies 26 to 29 which, in addition to the mechanical stability, also provide the electric connection between the electronic components contained in the bodies 26 to 29. In addition, ends 30 and 31 of the stamped grid structure are provided which remain free and which are assembled with the housed components 32 and 33 in another treatment operation. The result of this assembling operation is illustrated in FIG. 13.

Figure 14:
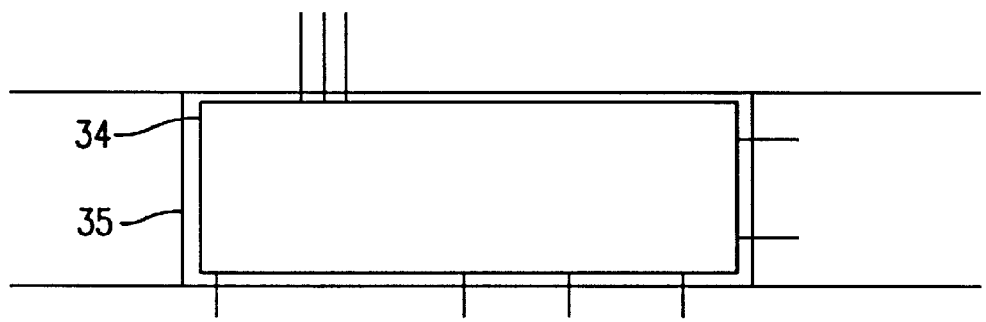

The resulting mechanical bodies are mechanically and electrically connected with one another and have electronic components contained therein and housed components placed on the outside. This arrangement is now surrounded by a thermoplastic material by means of an injection molding operation, forming the control units 34 illustrated in FIG. 14, which are also surrounded by a holding frame 35.

Figure 15:
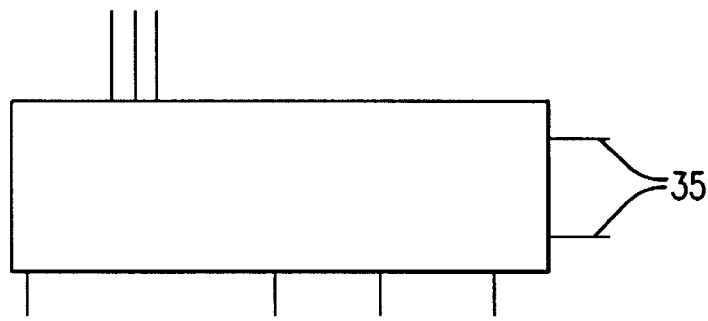

The holding frame 35 is cut off in a subsequent treatment operation, and the result is illustrated in FIG. 15.

Figure 16:
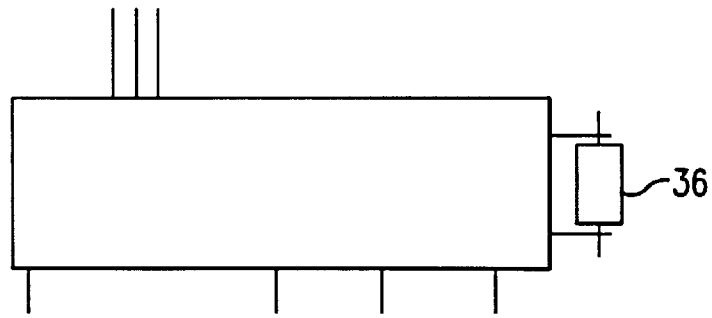

Subsequently, an additional component 36 can be arranged on free ends 35' of the stamped grid, and can be electrically connected with the ends 35' (FIG. 16).

Additional treatment operations are not shown in detail which are provided within the scope of the manufacturing steps and in which the stamped grid is trimmed. This is illustrated, for example, by an arrow 37 in FIG. 11 in which a projecting part of the stamped grid is removed.

The figures illustrate the few treatment steps by which an electronic control unit is manufactured which offers the highest degree of mechanical and electric stability.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Process for manufacturing an electronic control unit of the type comprising a housing surrounding a stamped sheet metal grid including a strip conductor structure having electronic components arranged thereon, and having contact parts formed in the stamped sheet metal grid and protruding out of the housing, said process comprising the steps of:

providing said stamped sheet metal grid with an auxiliary frame arranged at a periphery thereof, said auxiliary frame being connected with and supporting said contact parts in position relative to said strip conductor structure;

applying said electronic components on said sheet metal grid;

applying said housing over said electronic components by means of an injection molding process, said housing completely encasing said electronic components and the stamped sheet metal grid, leaving said auxiliary frame outside said housing, connected to said housing by said contact parts; and removing said auxiliary frame from said contact parts.

2. Process according to claim 1, wherein the contact parts are completed subsequently in a deforming process.

3. Process according to claim 1 wherein the stamped sheet metal grid is assembled with electronic components which are electrically connected with parts of the stamped sheet metal grid; and ends of the stamped sheet metal grid which remain free are assembled to and electrically connected with fit-on components.

4. Process according claim 3 wherein the fit-on components with the body are covered by a plastic material by means of an injection molding-around operation, while leaving free an exterior frame structure of the stamped sheet metal grid; and the frame structure is assembled with additional components.

5. Process according claim 3 wherein the fit-on components with the body are covered by a plastic material by means of an injection molding-around operation, while leaving free an exterior frame structure of the stamped sheet metal grid; and the frame structure is stamped off.

6. Process according to claim 4 wherein a duroplastic material is used as a plastic material for covering the body.

7. Process according to claim 4 wherein a thermoplastic material is used as the plastic material for the injection-molding-around operation.

8. Process according to claim 4 wherein the stamped sheet metal grid is trimmed following the injection-molding-around operations.

* * * * *